(12) United States Patent
Kanda et al.

(10) Patent No.: US 12,243,862 B2
(45) Date of Patent: Mar. 4, 2025

(54) OPTICAL RECEIVING CIRCUIT

(71) Applicant: Nippon Telegraph and Telephone Corporation, Tokyo (JP)

(72) Inventors: Atsushi Kanda, Musashino (JP); Toshihide Yoshimatsu, Musashino (JP); Yasuhiko Nakanishi, Musashino (JP); Masahiro Nada, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 466 days.

(21) Appl. No.: 17/785,314

(22) PCT Filed: Dec. 16, 2019

(86) PCT No.: PCT/JP2019/049187
§ 371 (c)(1),
(2) Date: Jun. 14, 2022

(87) PCT Pub. No.: WO2021/124398
PCT Pub. Date: Jun. 24, 2021

(65) Prior Publication Data
US 2023/0005897 A1    Jan. 5, 2023

(51) Int. Cl.
*H01L 25/16* (2023.01)
*H01L 23/00* (2006.01)

(52) U.S. Cl.
CPC ............ *H01L 25/167* (2013.01); *H01L 24/48* (2013.01); *H01L 2224/48139* (2013.01); *H01L 2924/12043* (2013.01); *H01L 2924/1205* (2013.01); *H01L 2924/1424* (2013.01)

(58) Field of Classification Search
CPC ......... H01L 24/05; H01L 24/06; H01L 24/48; H01L 24/49; H01L 25/167; H01L 2224/48139; H01L 2224/04042; H01L 2224/05554; H01L 2224/06515; H01L 2224/48091; H01L 2224/4813; H01L 2224/48137; H01L 2224/49109; H01L 2224/49175; H01L 2924/12043; H01L 2924/1205; H01L 2924/1424;
(Continued)

(56) References Cited

FOREIGN PATENT DOCUMENTS

| JP | H11-218651 A | 8/1999 |
| JP | 20135014 A | 1/2013 |
| JP | 2013005014 A * | 1/2013 |

(Continued)

*Primary Examiner* — Nelson Garces
(74) *Attorney, Agent, or Firm* — Workman Nydegger

(57) ABSTRACT

In an optical receiver circuit which suppresses an unnecessary increase in impedance and occurrences of resonance and radiation noise and which produces preferable high-frequency transmission characteristics, a PD submount mounted with a PD chip and a chip capacitor and a TIA carrier mounted with a TIA chip are electrically connected to each other by a bonding wire. The chip includes an anode electrode pad and a cathode electrode pad, anode electrode-side ground pads are formed at positions that sandwich the pad, and cathode electrode-side ground pads are formed at positions that sandwich the pad. A wire electrically connects the pad and a signal pad for input of the chip to each other, a wire electrically connects the pad and the capacitor to each other, and a wire electrically connects the pads and the pads to each other.

11 Claims, 16 Drawing Sheets

(58) Field of Classification Search
CPC . H01L 2924/00014; H01L 2924/15151; H01L 31/02; H01L 31/10
See application file for complete search history.

(56) References Cited

FOREIGN PATENT DOCUMENTS

| | | | | |
|---|---|---|---|---|
| JP | 5296838 | B2 | 6/2013 | |
| JP | 2016-18799 | A | 2/2016 | |
| JP | 2016018799 | A * | 2/2016 | |
| JP | 2016100360 | A * | 5/2016 | ........... G06K 9/0004 |

* cited by examiner

OPTICAL RECEIVING CIRCUIT

TECHNICAL FIELD

The present invention relates to an optical receiver circuit that converts a high-speed broadband optical signal into an electrical signal.

BACKGROUND ART

Recently, transmission rates required for optical communication systems are becoming higher with each passing year, and as transmission rates of optical signals increase, there is a growing need for wider bandwidths in optical receiver circuits that convert such an optical signal into an electrical signal.

In addition, as techniques for increasing transmission rates, progress has been made in techniques for processing a plurality of channel signals in parallel and multiplexing optical signals corresponding to parallelized electrical signals by wavelength division or the like in addition to techniques for increasing a transmission rate per channel. Against such a backdrop, demands are growing for techniques that enable optical signals of multiple channels to be collectively converted into electrical signals by a single optical receiver circuit.

An optical receiver circuit is constituted by a light-receiving element which converts an optical signal into an electrical signal, a transimpedance amplifier (hereinafter, referred to as TIA) which converts a current signal in the electrical signal obtained by the light-receiving element into a voltage signal and amplifies and outputs the voltage signal, and the like. Generally, a photodiode (hereinafter, referred to as PD) for high-speed optical communication is used as the light-receiving element.

By integrating a plurality of PDs into a single chip, an optical receiver circuit of multiple channels enables optical signals of multiple channels to be converted into electrical signals of multiple channels by a single PD chip. In addition, for example, according to a TIA of multiple channels disclosed in PTL 1 which includes a plurality of input/output signal terminals, current signals of multiple channels can be converted into voltage signals and the voltage signals can be amplified and output by a single TIA chip.

FIG. 11 is a plan view showing an implementation example related to a conventional optical receiver circuit 1000A for high-speed transmission. FIG. 12 is a sectional view taken along a XII-XII direction of the optical receiver circuit 1000A shown in FIG. 11.

Referring to FIGS. 11 and 12, the optical receiver circuit 1000A is configured to receive an input of an optical signal LA of a single channel with a back-illuminated PD chip 10 and output an electrical signal of a single channel.

In the optical receiver circuit 1000A, a front surface of a metalized PD submount 40 is mounted with the PD chip 10 and a chip capacitor 30. In addition, a front surface of a metalized TIA carrier 42 is mounted with a TIA chip 20. The optical receiver circuit 1000A is constructed by electrically connecting the PD submount 40 and the TIA carrier 42 which are mounted with components to each other using bonding wires 51 and 57 as electric wires that conduct electricity. In this state, the bonding wires 51 and 57 are arranged above the front surfaces of the PD submount 40 and the TIA carrier 42. The PD submount 40 and the TIA carrier 42 in this case can be considered component mounting substrates.

The PD chip 10 includes a single PD element which converts the optical signal LA of a single channel into an electrical signal. In addition, the PD chip 10 also includes an anode electrode and a cathode electrode of the PD element, an anode electrode pad 11 which is provided on an upper surface-side of the element and which is connected to the anode electrode, and a cathode electrode pad 12 which is provided on the upper surface-side of the element and which is connected to the cathode electrode.

The PD submount 40 is provided with a through-hole 41 into which the optical signal LA is to be incident from a rear surface of the PD chip 10 so as to penetrate the PD submount 40 from a rear surface to a front surface thereof. In other words, the PD element is configured as the back-illuminated PD chip 10 which is provided on a front surface-side of the PD submount 40 and which has the through-hole 41 into which the optical signal LA is to be independently incident from the rear surface of the PD submount 40.

A diameter of the through-hole 41 is sufficiently larger than a diameter of light reception of the PD chip 10. One reason therefor is that, normally, in order to avoid an effect of reflected return light in the optical signal LA, a configuration is adopted in which the optical signal LA is incident at an angle that deviates from a normal direction with respect to a light-receiving surface of the PD chip 10. Another reason is to satisfy demands for a certain degree of freedom of a mounting position of the PD chip 10 with respect to the PD submount 40.

The chip capacitor 30 assumes a role of a relay terminal which applies DC voltage to the cathode electrode of the PD chip 10 from the outside and, at the same time, separates an AC component and a DC component from each other and blocks leakage of an AC signal to the outside. The TIA chip 20 is a TIA of a single channel with an amplifier circuit of a single system, and includes a signal pad 21 for external input of an electrical signal and a signal pad 22 for external output of a differential electrical signal. In addition, the TIA chip 20 includes a ground pad 23 for grounding and a power supply/control/monitor pad 24 for supplying power, control, and monitoring.

The bonding wire 51 is used to electrically connect the anode electrode pad 11 of the PD chip 10 and the signal pad 21 for input of the TIA chip 20 to each other. A bonding wire 52 is used to electrically connect the cathode electrode pad 12 of the PD chip 10 and the chip capacitor 30 to each other. The bonding wire 57 is used to electrically connect the ground pad 23 of the TIA chip 20 and a ground potential of the PD submount 40 to each other.

In the optical receiver circuit 1000A configured as described above, the bonding wire 57 is used to electrically connect the ground pad 23 of the TIA chip 20 and the ground potential of the PD submount 40 to each other. In this case, while a gap must be provided between the PD chip 10 and the TIA chip 20, the gap must be wide enough to prevent interference with a capillary tool of a wire bonding device. As a result, the optical receiver circuit 1000A is limited in its ability to reduce a length of the bonding wire 51 which connects the anode electrode pad 11 of the PD chip 10 and the signal pad 21 of the TIA chip 20 to each other. In the optical receiver circuit 1000A, all of the bonding wires 51, 52, and 57 are arranged above the front surfaces of the PD submount 40 and the TIA carrier 42.

Let us now conceive conditions of use of the optical receiver circuit 1000A which increases a transmission rate of a recent optical communication system. In this case, impedance due to inductance of the bonding wire 51 which connects the anode electrode pad 11 of the PD chip 10 and the signal pad 21 of the TIA chip 20 to each other increases. Therefore, in the optical receiver circuit 1000A, there is a problem in that transmission loss of a signal increases and frequency characteristics degrade. There is also a problem in the optical receiver circuit 1000A in that, due to a return current flowing so as to bypass a return path, high-frequency transmission characteristics degrade and the likelihood of occurrences of unnecessary resonance, radiation noise, and the like increases.

The latter problem will now be described in greater detail. In the optical receiver circuit 1000A, when the optical signal LA incident from the rear surface of the PD chip 10 is received by a light-receiving unit (a light-receiving element) of the PD element, an electrical signal is generated. A high-frequency signal due to a photocurrent of the electrical signal is transmitted from the light-receiving unit of the PD chip 10 via the anode electrode pad 11 and the bonding wire 51 to a transmission system which extends to the signal pad 21 of the TIA chip 20. In this case, a return current flows via the bonding wire 57 and the ground potential of the PD submount 40 from the ground pad 23 of the TIA chip 20 in an opposite direction to a direction of transmission of the high-frequency signal of the photocurrent with respect to the transmission system. However, due to the presence of the through-hole 41 into which the optical signal LA is to be incident, the return path is blocked and the return current flows so as to bypass the through-hole 41. When a return current flows so as to bypass the return path in this manner, the problem described above arises.

FIG. 13 is a plan view showing another implementation example related to a conventional optical receiver circuit 1000B for high-speed transmission. FIG. 14 is a sectional view taken along a XIV-XIV direction of the optical receiver circuit 1000B shown in FIG. 13.

Referring to FIGS. 13 and 14, the optical receiver circuit 1000B differs from the optical receiver circuit 1000A in that the optical receiver circuit 1000B is configured to receive an input of optical signals LB of multiple channels with a back-illuminated PD chip 100 and output multichannel electrical signals of multiple channels.

In the optical receiver circuit 1000B, a front surface of a metalized PD submount 400 is mounted with the PD chip 100 and a chip capacitor 300. In addition, a front surface of a metalized TIA carrier 420 is mounted with a TIA chip 200. The optical receiver circuit 1000B is constructed by electrically connecting the PD submount 400 and the TIA carrier 420 which are mounted with components to each other using bonding wires 510 and 570 as electric wires that conduct electricity. In this state, the bonding wires 510 and 570 are arranged above front surfaces of the PD submount 400 and the TIA carrier 420. The PD submount 400 and the TIA carrier 420 in this case can also be considered component mounting substrates.

The PD chip 100 includes four arrayed PD elements which convert the optical signals LB of four channels into electrical signals. In addition, the PD chip 100 also includes an anode electrode and a cathode electrode of the PD elements, an anode electrode pad 110 which is provided on an upper surface-side of the elements and which is connected to the anode electrode, and a cathode electrode pad 120 which is provided on the upper surface-side of the elements and which is connected to the cathode electrode.

The PD submount 400 is provided with a single through-hole 410 large enough to provide four channels through which the optical signals LB of four channels are to be incident from a rear surface of the PD chip 100 so as to penetrate the PD submount 400 from a rear surface to a front surface thereof. In other words, each PD element is configured as the back-illuminated PD chip 100 which is provided on a front surface-side of the PD submount 400 and which has the through-hole 410 into which the optical signals LB are to be collectively incident from the rear surface of the PD submount 400.

A size of the through-hole 410 is sufficiently larger than a diameter of light reception of the PD chip 100. One reason therefor is that, normally, in order to avoid an effect of reflected return light in the optical signals LB, a configuration is adopted in which the optical signals LB are incident at an angle that deviates from a normal direction with respect to a light-receiving surface of the PD chip 100. Another reason is to satisfy demands for a certain degree of freedom of a mounting position of the PD chip 100 with respect to the PD submount 400.

Even in the case of the chip capacitor 300 of four systems, the chip capacitor 300 assumes a role of a relay terminal which applies DC voltage to the cathode electrode of each PD chip 100 from the outside and, at the same time, separates an AC component and a DC component from each other and blocks leakage of an AC signal to the outside. The TIA chip 200 is a TIA of multiple channels with a four-system amplifier circuit, and includes a signal pad 210 for external input of an electrical signal and a signal pad 220 for external output of a differential electrical signal. In addition, the TIA chip 200 includes a ground pad 230 for grounding and a power supply/control/monitor pad 240 for supplying power, control, and monitoring.

The bonding wire 510 is used to electrically connect the anode electrode pad 110 of the PD chip 100 and the signal pad 210 for input of the TIA chip 200 to each other. A bonding wire 520 is used to electrically connect the cathode electrode pad 120 of the PD chip 100 and the chip capacitor 300 to each other. The bonding wire 570 is used to electrically connect the ground pad 230 of the TIA chip 200 and a ground potential of the PD submount 400 to each other.

Even in the case of the optical receiver circuit 1000B configured as described above, the bonding wire 570 is used to electrically connect the ground pad 230 of the TIA chip 200 and the ground potential of the PD submount 400 to each other. In this case, providing a gap wide enough to prevent interference with a capillary tool of a wire bonding device between the PD chip 100 and the TIA chip 200 limits an amount by which a length of the bonding wire 510 can be reduced. Even with the optical receiver circuit 1000B, all of the bonding wires 510, 520, and 570 are arranged above the front surfaces of the PD submount 40 and the TIA carrier 42.

In the case of the optical receiver circuit 1000B, the increased number of channels makes an effect of the problems more conspicuous as compared to the optical receiver circuit 1000A. FIG. 15 is a diagram showing a path of a return current in an implementation example of the optical receiver circuit 1000B.

Referring to FIG. 15, in the optical receiver circuit 1000B of multiple channels, the problem in that return currents 670 and 680 with respect to a transmission of a high-frequency signal current 610 are blocked by the through-hole 410 is similar to the case of the optical receiver circuit 1000A. However, the through-hole 410 in the optical receiver circuit 1000B is formed by consolidating multiple channels into a single large hole for machining reasons. Accordingly, a bypass of the return current 680 increases, particularly with respect to inner channels which indicate a side of a center of the optical receiver circuit 1000B. Therefore, in the optical receiver circuit 1000B, there is a problem that degradation of high-frequency transmission characteristics is significant and unnecessary resonance, radiation noise, and the like are more likely to occur particularly in inner channels.

In addition, in the optical receiver circuit 1000B, since a distance between adjacent channels is short enough to be comparable to a bonding wire length, the bonding wires 510 and 520 are readily affected when unnecessary resonance, radiation noise, and the like occur. More specifically, the bonding wires 510 and 520 more readily pick up electromagnetic waves radiated from counterpart bonding wires of an adjacent channel. As a result, the bonding wires 510 and 520 are readily susceptible to so-called crosstalk in which a signal leaked from the adjacent channel is superimposed on their own signal.

FIG. 16 is a diagram showing an example of frequency characteristics of the optical receiver circuit 1000B as a relationship of normalized light/electric conversion gain (dB) with respect to a normalized frequency. In FIG. 16, focusing on channels of the return current 680 with respect to a transmission of the high-frequency signal current 610, transmission frequency characteristics of lane 1 being a channel adjacent to lane 0 being an innermost channel when lane 1 is considered a main signal is depicted by a bold line.

In addition, FIG. 16 shows characteristics of crosstalk from lanes 0 and 2 corresponding to the two channels that are adjacent to the channel of lane 1 and characteristics of crosstalk from lane 3 being an outermost channel that is adjacent to the channel of lane 2. Furthermore, in FIG. 16, an abscissa represents normalized frequencies with a frequency corresponding to a transmission rate of a desired optical communication system as a reference value 1 and an ordinate displays a ratio of normalized light with respect to an electric conversion based on the transmission frequency characteristics of lane 1 as a gain dB.

FIG. 16 reveals that a ratio between the transmission frequency characteristics of lane 1 depicted by the bold line and characteristics of crosstalk from adjacent lane 2 depicted by a dotted line approaches approximately 5 dB in terms of a difference value of normalized light/electric conversion gain with respect to the normalized frequency. In this manner, a close ratio of crosstalk characteristics which approach each other may cause a degradation in high-frequency transmission characteristics and occurrences of unnecessary resonance and radiation noise.

In particular, in the optical receiver circuit 1000B, for example, a length of ¼ wavelength in free space of a signal having a transmission rate of around 10 Gbaud or higher is more or less the same as a bonding wire length. In such a case, the bonding wires 510 and 520 act as an antenna and more readily pick up an electromagnetic wave radiated from counterpart bonding wires of an adjacent channel. Accordingly, quality degradation of high-frequency transmission characteristics due to crosstalk becomes conspicuous.

CITATION LIST

Patent Literature

[PTL 1] Japanese Patent No. 5296838

SUMMARY OF THE INVENTION

The present invention has been made in order to solve problems such as that described above. An object of an embodiment of the present invention is to provide an optical receiver circuit which suppresses an unnecessary increase in impedance and occurrences of resonance and radiation noise and which produces preferable high-frequency transmission characteristics.

In order to achieve the object described above, an aspect of the present invention is an optical receiver circuit including: a light-receiving element which converts an optical signal into an electrical signal; and a transimpedance amplifier which amplifies and outputs the electrical signal obtained by the light-receiving element, wherein the light-receiving element includes: an anode electrode and a cathode electrode; an anode electrode pad which is connected to the anode electrode; a cathode electrode pad which is connected to the cathode electrode; a plurality of anode electrode-side ground pads which are arranged so as to sandwich the anode electrode pad; and a plurality of cathode electrode-side ground pads which are arranged so as to sandwich the cathode electrode pad, and the optical receiver circuit includes:

a first electrical conductor which electrically connects the anode electrode-side ground pad and the cathode electrode-side ground pad to each other;

a second electrical conductor which electrically connects the anode electrode-side ground pad and a ground pad provided on an element front surface-side of the transimpedance amplifier to each other; and a third electrical conductor which electrically connects at least one of the cathode electrode-side ground pad and the anode electrode-side ground pad and a ground potential to each other.

In the optical receiver circuit according to the aspect described above, a multichannel configuration can be realized when the light-receiving element and the transimpedance amplifier are respectively provided in plurality, the first electrical conductor is constituted by first electrical conductors of which the number is twice that of the plurality of light-receiving elements and each of which corresponds to each light-receiving element, the second electrical conductor is constituted by second electrical conductors of which the number is twice that of combinations of the plurality of light-receiving elements and the plurality of transimpedance amplifiers and each of which corresponds to each combination, and the third electrical conductor is constituted by third electrical conductors of which the number is twice that of the plurality of light-receiving elements and each of which corresponds to each light-receiving element.

In addition, favorably, any of the optical receiver circuits described above is applied in a case where the light-receiving element or the plurality of light-receiving elements are provided on a front surface-side of a component mounting substrate and the light-receiving element or the plurality of light-receiving elements are configured as a back-illuminated chip having a single through-hole so as to cause an optical signal to be independently incident or to cause optical signals to be collectively incident from a rear surface of the component mounting substrate.

According to any of the configurations described above, in an optical receiver circuit, an unnecessary increase in impedance and occurrences of resonance and radiation noise can be suppressed and preferable high-frequency transmission characteristics can be produced. In addition, similar advantages can be gained even when the optical receiver circuit is configured so as to accommodate multiple channels.

DESCRIPTION OF EMBODIMENTS

Hereinafter, optical receiver circuits related to several embodiments of the present invention will be described in detail with reference to the drawings.

First Embodiment

Figure 1:
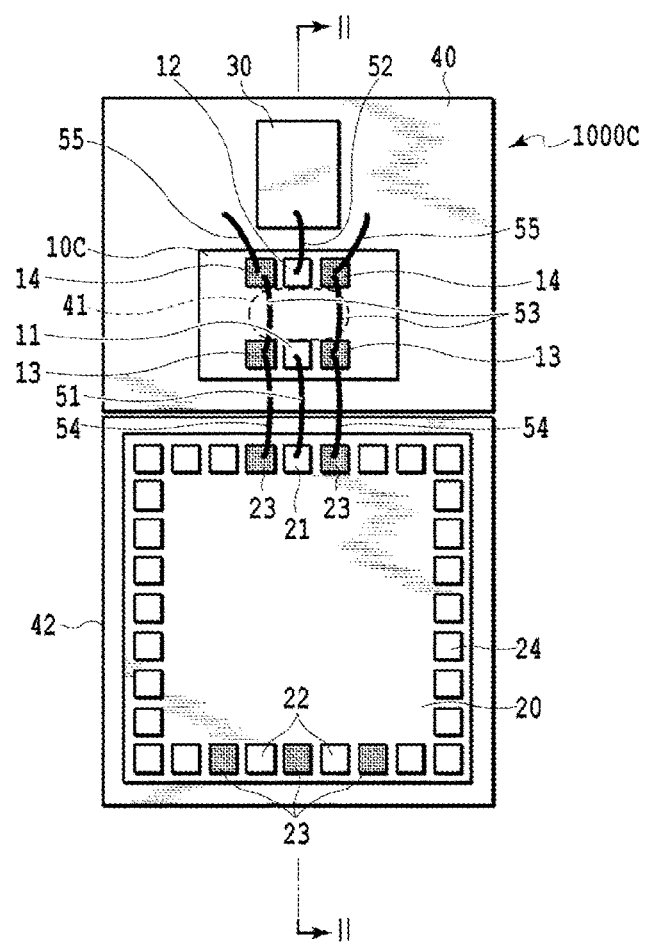
FIG. 1 is a plan view showing an implementation example of an optical receiver circuit for high-speed transmission according to a first embodiment of the present invention.
Figure 2:
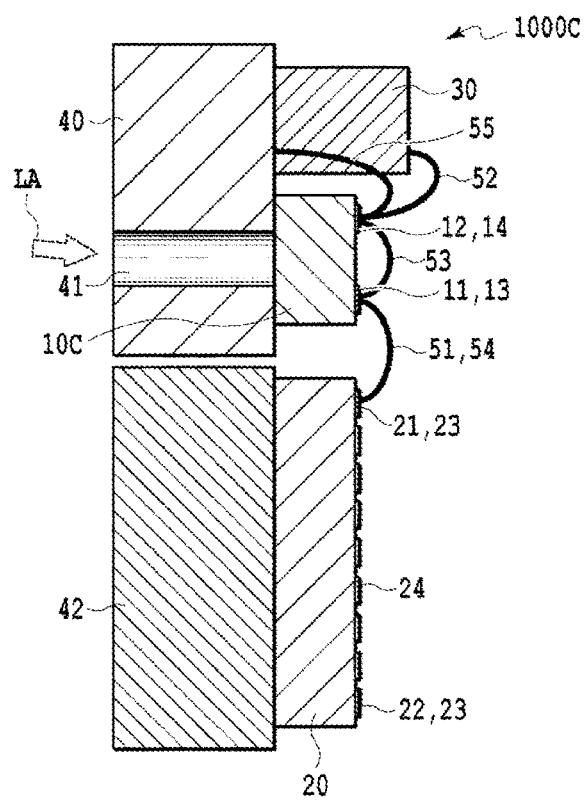
FIG. 2 is a sectional view taken along a II-II direction of the optical receiver circuit shown in FIG. 1.

FIG. 1 is a plan view showing an implementation example of an optical receiver circuit 1000C for high-speed transmission according to a first embodiment of the present invention. FIG. 2 is a sectional view taken along a II-II direction of the optical receiver circuit 1000C shown in FIG. 1.

Referring to FIGS. 1 and 2, the optical receiver circuit 1000C differs from the conventional optical receiver circuit 1000A in the number of types and an arrangement of pads of a PD chip 100 and in a connection pattern and routing of bonding wires 51, 52, 53, 54, and 55. The optical receiver circuit 1000C is also configured to receive an input of an optical signal LA of a single channel with the back-illuminated PD chip 100 and output an electrical signal of a single channel.

In the optical receiver circuit 1000C, a front surface of a metalized PD submount 40 is mounted with the PD chip 100 and a chip capacitor 30. In addition, a front surface of a metalized TIA carrier 42 is mounted with a TIA chip 20. The optical receiver circuit 1000C is constructed by electrically connecting the PD submount 40 and the TIA carrier 42 which are mounted with components to each other using bonding wires 51 and 54 as electric wires that conduct electricity. In this state, the bonding wires 51 and 54 are arranged above front surfaces of the PD submount 40 and the TIA carrier 42. The PD submount 40 and the TIA carrier 42 in this case can also be considered component mounting substrates.

The PD chip 100 includes a single PD element which converts the optical signal LA of a single channel into an electrical signal. In addition, the PD chip 100 also includes an anode electrode and a cathode electrode of the PD element, an anode electrode pad 11 which is provided on an upper surface-side of the element and which is connected to the anode electrode, and a cathode electrode pad 12 which is provided on the upper surface-side of the element and which is connected to the cathode electrode. Furthermore, the PD chip 10C includes a pair of anode electrode-side ground pads 13 which are provided on an element upper surface-side and which are arranged so as to sandwich the anode electrode pad 11. Moreover, the PD chip 10C includes a pair of cathode electrode-side ground pads 14 which are provided on the element upper surface-side and which are arranged so as to sandwich the cathode electrode pad 12. In the PD chip 10C, the anode electrode-side ground pads 13 and the cathode electrode-side ground pads 14 have been newly added.

The PD submount 40 is provided with a through-hole 41 into which the optical signal LA is to be incident from a rear surface of the PD chip 10C so as to penetrate the PD submount 40 from a rear surface to a front surface thereof. In other words, the PD element is configured as the back-illuminated PD chip 10C which is provided on a front surface-side of the PD submount 40 and which has the through-hole 41 into which the optical signal LA is to be independently incident from the rear surface of the PD submount 40.

A diameter of the through-hole 41 is sufficiently larger than a diameter of light reception of the PD chip 10C. One reason therefor is that, normally, in order to avoid an effect of reflected return light in the optical signal LA, a configuration is adopted in which the optical signal LA is incident at an angle that deviates from a normal direction with respect to a light-receiving surface of the PD chip 10C. Another reason is to satisfy demands for a certain degree of freedom of a mounting position of the PD chip 10C with respect to the PD submount 40.

Even in this case, the chip capacitor 30 assumes a role of a relay terminal which applies DC voltage to the cathode electrode of the PD chip 10C from the outside and, at the same time, separates an AC component and a DC component from each other and blocks leakage of an AC signal to the outside. The TIA chip 20 is a TIA of a single channel with an amplifier circuit of a single system, and includes a signal pad 21 for external input of an electrical signal and a signal pad 22 for external output of a differential electrical signal. In addition, the TIA chip 20 includes a ground pad 23 for grounding and a power supply/control/monitor pad 24 for supplying power, control, and monitoring.

The PD chip 10C includes the anode electrode pad 11 and the cathode electrode pad 12 which are arranged on the upper surface-side. In addition thereto, the pair of anode electrode-side ground pads 13 is formed at opposing positions that sandwich the anode electrode pad 11 on the upper surface-side of the PD chip 10C. Furthermore, the pair of cathode electrode-side ground pads 14 is formed at opposing positions that sandwich the cathode electrode pad 12 on the upper surface-side of the PD chip 10C. It is assumed that the upper surface-side of the PD chip 10C refers to a front surface-side and a lower surface-side refers to a rear surface-side.

The bonding wire 51 is used to electrically connect the anode electrode pad 11 of the PD chip 10C and the signal pad 21 for input of the TIA chip 20 to each other. The bonding wire 52 is used to electrically connect the cathode electrode pad 12 of the PD chip 10C and the chip capacitor 30 to each other.

In addition to the bonding wires 51 and 52, the bonding wire 53 which electrically connects the anode electrode-side ground pad 13 and the cathode electrode-side ground pad 14 of the PD chip 10C to each other is used. The bonding wire 53 can be considered the first electrical conductor. Furthermore, the bonding wire 54 which electrically connects the anode electrode-side ground pad 13 of the PD chip 10C and the ground pad 23 of the TIA chip 20 to each other is used. The bonding wire 54 can be considered the second electrical conductor.

In addition thereto, the bonding wire 55 which electrically connects the cathode electrode-side ground pad 14 of the PD chip 10C and a ground potential of the PD submount 40 to each other is used. The bonding wire 55 can be considered the third electrical conductor. The bonding wire 55 is a substitute for the bonding wire 57 which electrically connects the ground pad 23 of the TIA chip 20 and a ground potential of the PD submount 40 to each other in the optical receiver circuit 1000A. Even with the optical receiver circuit 1000C, all of the bonding wires 51, 52, 53, 54, and 55 are arranged above front surfaces of the PD submount 40 and the TIA carrier 42.

Alternatively, the bonding wire 55 may be used to electrically connect the anode electrode-side ground pad 13 of the PD chip 10C and the ground potential of the PD submount 40 to each other. In addition, the bonding wire 55 may be used to electrically connect both the cathode electrode-side ground pad 14 and the anode electrode-side ground pad 13 of the PD chip 10C and the ground potential of the PD submount 40 to each other.

In the optical receiver circuit 1000C configured as described above, the anode electrode pad 11 of the PD chip 10C and the signal pad 21 of the TIA chip 20 are electrically connected to each other by the bonding wire 51. In addition, with respect to the bonding wire 51, the anode electrode-side ground pad 13 of the PD chip 10C and the ground pad 23 of the TIA chip 20 are electrically connected to each other by the bonding wire 54 so as to sandwich the bonding wire 51. Therefore, signal wirings of the bonding wires 51 and 54 form a coplanar line, and even when the bonding wire 51 is slightly extended, an increase in impedance due to inductance of the bonding wire 51 is suppressed. As a result, preferable high-frequency characteristics can be produced.

In addition, in the optical receiver circuit 1000C, since a return current flows without bypassing a return path, high-frequency transmission characteristics do not degrade and the likelihood of occurrences of unnecessary resonance, radiation noise, and the like decreases.

Specifically, for example, when the optical signal LA incident from the rear surface of the PD chip 10C is received by a light-receiving unit (a light-receiving element) of the PD element, an electrical signal is generated. A high-frequency signal due to a photocurrent of the electrical signal is transmitted from the light-receiving unit of the PD chip 10C via the anode electrode pad 11 and the bonding wire 51 to a transmission system which extends to the signal pad 21 of the TIA chip 20. In this case, a return current flows in an opposite direction to a direction of transmission of the high-frequency signal of the photocurrent with respect to the transmission system.

The return current is first routed through the bonding wire 54 which connects the anode electrode-side ground pad 13 of the PD chip 10C and the ground pad 23 of the TIA chip 20 to each other. The return current is next routed through the bonding wire 53 which connects the anode electrode-side ground pad 13 and the cathode electrode-side ground pad 14 of the PD chip 10C to each other. Furthermore, the return current is routed through the bonding wire 55 which connects the cathode electrode-side ground pad 14 of the PD chip 10C and the ground potential of the PD submount 40 to each other and flows through the ground potential. As a result, the return current flowing through the ground potential of the PD submount 40 is no longer required to bypass the return path that is created by the through-hole 41 and, accordingly, occurrences of unnecessary resonance and radiation noise are suppressed and preferable high-frequency transmission characteristics are produced.

In addition, the cathode electrode-side ground pad 14 of the PD chip 10C and the ground potential of the PD submount 40 are electrically connected to each other by the bonding wire 55. Therefore, there is no longer a constraint to make the gap between the PD chip 10C and the TIA chip 20 wide enough to prevent interference with a capillary tool of a wire bonding device. Accordingly, the length of the bonding wire 51 which electrically connects the anode electrode pad 11 of the PD chip 10C and the signal pad 21 of the TIA chip 20 to each other can be freely controlled. As a result, combined with the effect of constructing the coplanar line formed by the bonding wire 51 and the bonding wire 54, preferable high-frequency characteristics can be produced.

In the optical receiver circuit 1000C, cases may arise where various reasons such as interference with other components and constraints on mounting make it difficult to electrically connect the cathode electrode-side ground pad 14 of the PD chip 10C and the ground potential of the PD submount 40 to each other with the bonding wire 55. Such cases can be relatively easily dealt with.

Figure 3:
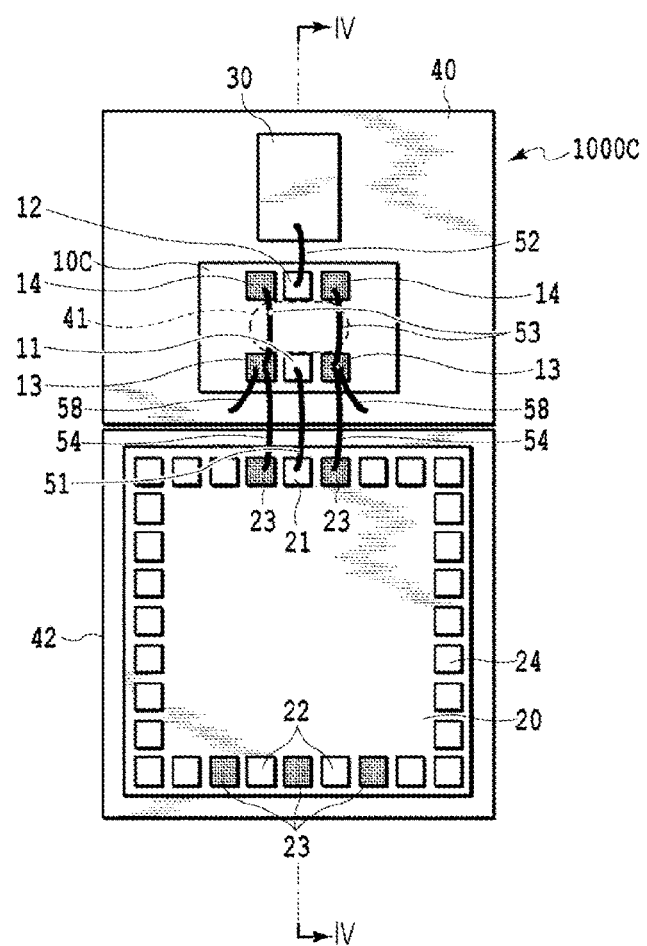
FIG. 3 is a plan view showing a modification example of the implementation example of the optical receiver circuit according to the first embodiment of the present invention.

FIG. 3 is a plan view showing a modification example of the implementation example of the optical receiver circuit 1000C. In addition, FIG. 4 is a sectional view taken along a IV-IV direction of the optical receiver circuit 1000C shown in FIG. 3.

Figure 4:
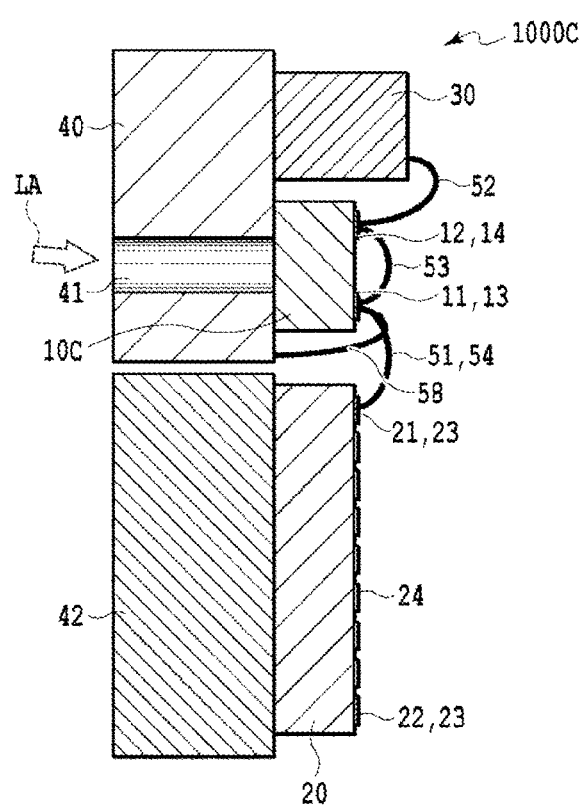
FIG. 4 is a sectional view taken along a IV-IV direction of the optical receiver circuit shown in FIG. 3.

Referring to FIGS. 3 and 4, in the optical receiver circuit 1000C, the anode electrode-side ground pad 13 of the PD chip 10C and the ground potential of the PD submount 40 are electrically connected to each other by a bonding wire 58 which is an electric wire that conducts electricity. In other words, in this case, the bonding wire 55 is not used and a configuration is adopted in which the cathode electrode-side ground pad 14 of the PD chip 10C and the ground potential of the PD submount 40 are not electrically connected to each other. In this case, while the effect of freeing the return current from having to bypass the return path created by the presence of the through-hole 41 is limited, the signal wirings of the bonding wire 51 and the bonding wire 54 form a coplanar line. Therefore, the effect of suppressing an increase in impedance due to the inductance of the bonding wire 51 to produce preferable high-frequency characteristics is sustained. Even in the case of the optical receiver circuit 1000C, all of the bonding wires 51, 52, 53, 54, and 58 are arranged above front surfaces of the PD submount 40 and the TIA carrier 42.

Second Embodiment

Figure 5:
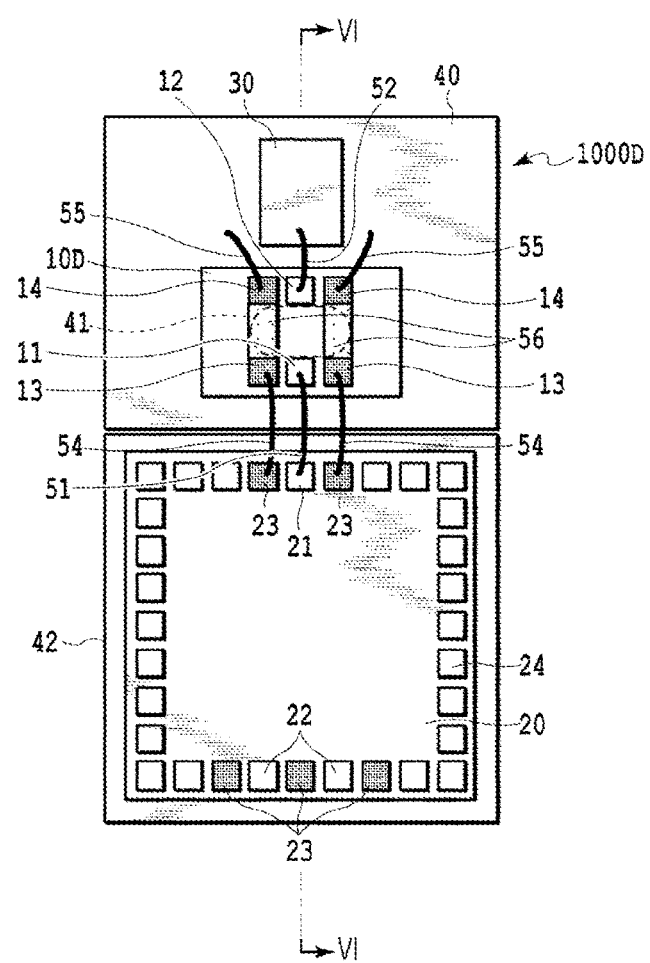
FIG. 5 is a plan view showing an implementation example of an optical receiver circuit for high-speed transmission according to a second embodiment of the present invention.

FIG. 5 is a plan view showing an implementation example of an optical receiver circuit 1000D for high-speed transmission according to a second embodiment of the present invention. In addition, FIG. 6 is a sectional view taken along a VI-VI direction of the optical receiver circuit 1000D shown in FIG. 5.

Figure 6:
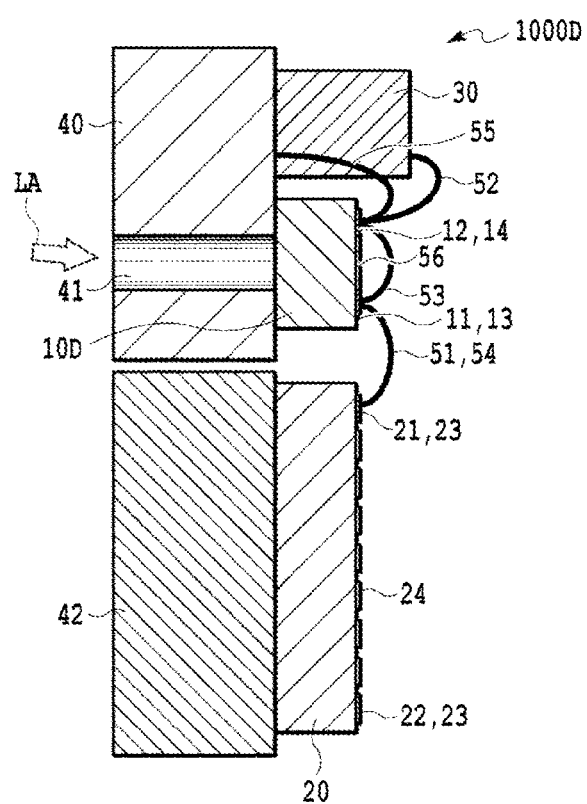
FIG. 6 is a sectional view taken along a VI-VI direction of the optical receiver circuit shown in FIG. 5.

Referring to FIGS. 5 and 6, in the optical receiver circuit 1000D, the anode electrode-side ground pad 13 and the cathode electrode-side ground pad 14 of a PD chip 10D are electrically connected to each other by a wiring pattern 56 as the first electrical conductor. Accordingly, the optical receiver circuit 1000D differs from the optical receiver circuit 1000C described earlier in not using the bonding wire 53 that is an electric wire but using the wiring pattern 56 that is provided as a substitute for the electric connection. In other words, with the exception of the difference between using the bonding wire 53 and providing the wiring pattern 56, the optical receiver circuit 1000D is configured in a same form as the optical receiver circuit 1000C.

Even in the optical receiver circuit 1000D, the anode electrode-side ground pad 13 of the PD chip 10D and the ground pad 23 of the TIA chip 20 are electrically connected to each other by the bonding wire 54. The bonding wire 54 can be considered the second electrical conductor. In addition, the cathode electrode-side ground pad 14 of the PD chip 10D and the ground potential of the PD submount 40 are electrically connected to each other by the bonding wire 55. The bonding wire 55 can be considered the third electrical conductor. In the case of the optical receiver circuit 1000D, the signal wirings of the bonding wires 51 and 54 form a coplanar line. Therefore, even when the bonding wire 51 is slightly extended, an increase in impedance due to inductance of the bonding wire 51 is suppressed. As a result, preferable high-frequency characteristics can be produced. In addition, even with the optical receiver circuit 1000D, all of the bonding wires 51, 52, 54, and 55 are arranged above front surfaces of the PD submount 40 and the TIA carrier 42.

Furthermore, even in the optical receiver circuit 1000D, since a return current flows without bypassing a return path, high-frequency transmission characteristics do not degrade and the likelihood of occurrences of unnecessary resonance, radiation noise, and the like decreases.

Specifically, for example, when the optical signal LA incident from the rear surface of the PD chip 10D is received by a light-receiving unit (a light-receiving element) of the PD element, an electrical signal is generated. A high-frequency signal due to a photocurrent of the electrical signal is transmitted from the light-receiving unit of the PD chip 10D via the anode electrode pad 11 and the bonding wire 51 to a transmission system which extends to the signal pad 21 of the TIA chip 20. In this case, a return current flows in an opposite direction to a direction of transmission of the high-frequency signal of the photocurrent with respect to the transmission system.

The return current is first routed through the bonding wire 54 which connects the anode electrode-side ground pad 13 of the PD chip 10D and the ground pad 23 of the TIA chip 20 to each other. The return current is next routed through the wiring pattern 56 which connects the anode electrode-side ground pad 13 and the cathode electrode-side ground pad 14 of the PD chip 10D to each other. Furthermore, the return current is routed through the bonding wire 55 which connects the cathode electrode-side ground pad 14 of the PD chip 10D and the ground potential of the PD submount 40 to each other and then flows through the ground potential. As a result, the return current flowing through the ground potential of the PD submount 40 is no longer required to bypass the return path that is created by the through-hole 41 and, accordingly, occurrences of unnecessary resonance and radiation noise are suppressed and preferable high-frequency transmission characteristics are produced.

In addition, in the optical receiver circuit 1000D, there is no longer a constraint to widen the gap between the PD chip 10D and the TIA chip 20 due to the electrical connection using the bonding wire 55. This is the same as in the first embodiment. As a result, the length of the bonding wire 51 can be freely controlled and, combined with the effect of constructing the coplanar line formed by the bonding wire 51 and the bonding wire 54, preferable high-frequency characteristics can be produced.

Furthermore, the wiring pattern 56 can be produced by simply adding a wiring pattern to a wiring layout mask when fabricating the PD chip 10D. Therefore, compared to the case of the first embodiment which uses the bonding wire 53, a smaller number of assembly steps is required and the optical receiver circuit 1000D can be constructed with greater ease. Even in the case of the optical receiver circuit 1000D, the return current flowing through the ground potential of the PD submount 40 is no longer required to bypass the return path that is created by the through-hole 41 and, occurrences of unnecessary resonance, radiation noise, and the like are suppressed and preferable high-frequency transmission characteristics are produced.

Furthermore, in the case of the optical receiver circuit 1000D, as bonding wire systems that electrically connect the anode electrode-side ground pad 13 and the cathode electrode-side ground pad 14 of the PD chip 10D to each other, one bonding wire system is provided with respect to each electrode. More specifically, the bonding wire 54 corresponds to the anode electrode-side ground pad 13 of the PD chip 10D and the bonding wire 55 corresponds to the cathode electrode-side ground pad 14 of the PD chip 10D. In the case of the optical receiver circuit 1000C, as the bonding wire systems that electrically connect the anode electrode-side ground pad 13 and the cathode electrode-side ground pad 14 of the PD chip 10C to each other, two bonding wire systems are provided with respect to each electrode. More specifically, the bonding wires 53 and 54 correspond to the anode electrode-side ground pad 13 and the bonding wires 53 and 55 correspond to the cathode electrode-side ground pad 14.

Such simplification of routing of bonding wires in the configuration enables areas of the anode electrode-side ground pad 13 and the cathode electrode-side ground pad 14 in the PD chip 10D to be reduced. In addition, a situation can be avoided where a failure such as wire peeling occurs due to two bonding wires coming into contact with each other on an upper surface of at least one of the anode electrode-side ground pad 13 and the cathode electrode-side ground pad 14 in the PD chip 10D.

When it is difficult to provide the bonding wire 55 which connects the cathode electrode-side ground pad 14 of the PD chip 10D and the ground potential of the PD submount 40 to each other, a similar countermeasure to that of the first embodiment may be performed. Specifically, without using the bonding wire 55, a configuration may be applied in which the anode electrode-side ground pad 13 of the PD chip 10D and the ground potential of the PD submount are electrically connected to each other with another bonding wire. Even in this case, while the effect of freeing the return current from having to bypass the return path created by the presence of the through-hole 41 is limited, an effect of suppressing an increase in impedance due to the inductance of the bonding wire 51 is sustained. As a result, preferable high-frequency characteristics are produced.

Third Embodiment

Figure 7:
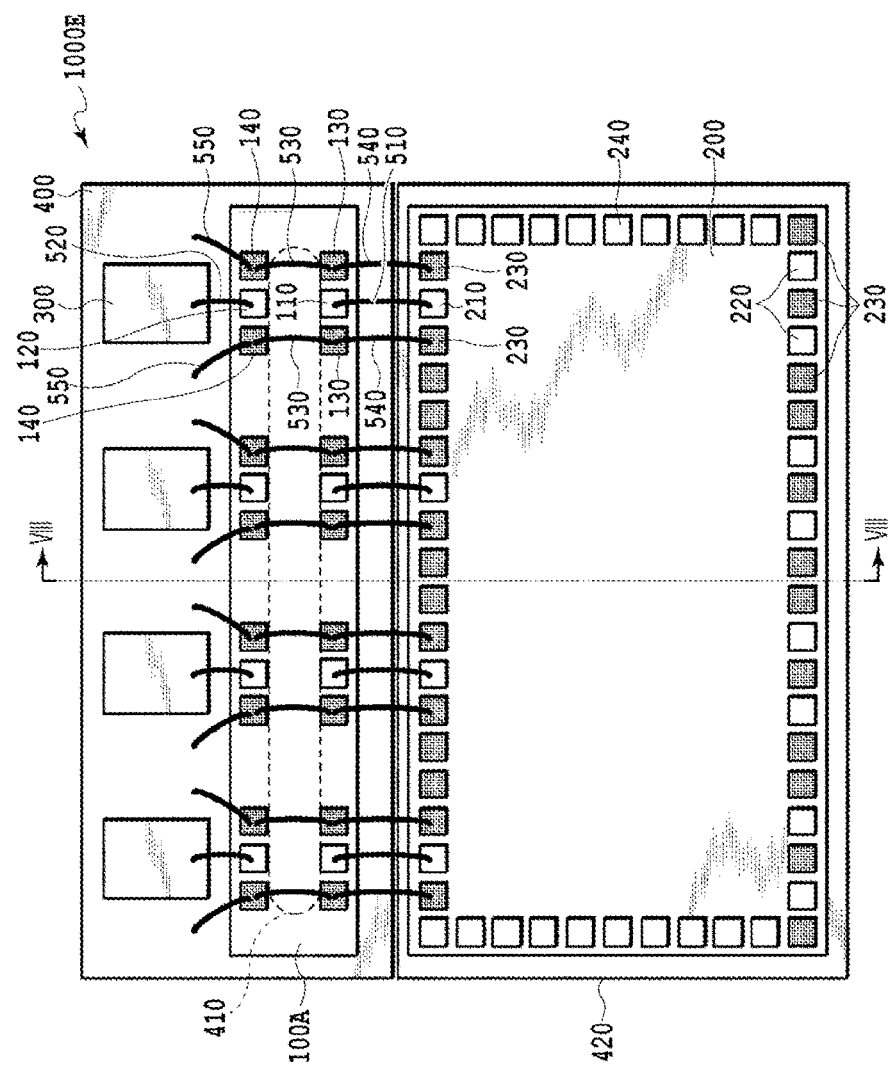
FIG. 7 is a plan view showing an implementation example of an optical receiver circuit for high-speed transmission according to a third embodiment of the present invention.
Figure 8:
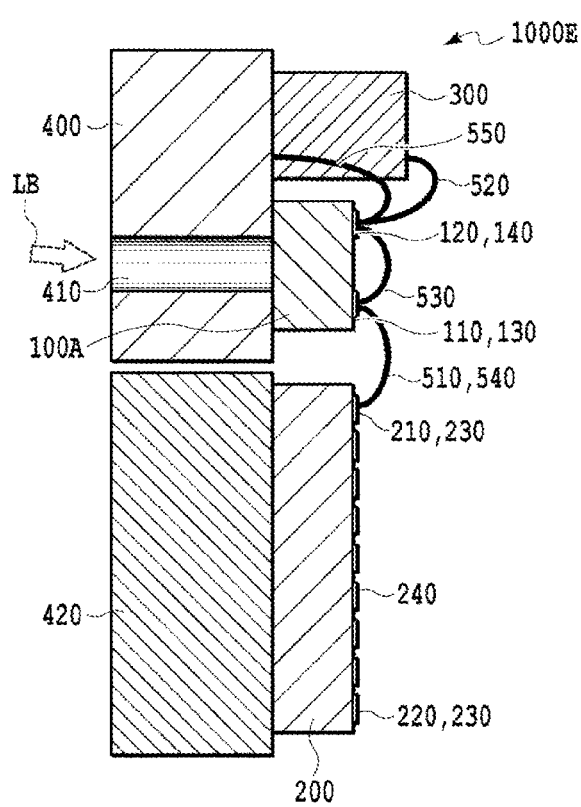
FIG. 8 is a sectional view taken along a VIII-VIII direction of the optical receiver circuit shown in FIG. 7.

FIG. 7 is a plan view showing an implementation example of an optical receiver circuit 1000E for high-speed transmission according to a third embodiment of the present invention. FIG. 8 is a sectional view taken along a VIII-VIII direction of the optical receiver circuit 1000E shown in FIG. 7.

The optical receiver circuit 1000C according to the first embodiment and the optical receiver circuit 1000D according to the second embodiment exemplify a configuration for a single channel in which an optical signal LA of a single channel is input and an electrical signal of a single channel is output. Referring to FIGS. 7 and 8, the illustrated optical receiver circuit 1000E is configured to receive an input of optical signals LB of four channels as an example of multiple channels with a back-illuminated PD chip 100A and to output electrical signals of four channels. In other words, the optical receiver circuit 1000E represents a configuration in which multichanneling is applied to the optical receiver circuit 1000C according to the first embodiment.

In the optical receiver circuit 1000E, a front surface of a metalized PD submount 400 is mounted with the PD chip 100A and a chip capacitor 300. In addition, a front surface of a metalized TIA carrier 420 is mounted with a TIA chip 200. The optical receiver circuit 1000E is constructed by electrically connecting the PD submount 400 and the TIA carrier 420 which are mounted with components to each other using bonding wires 510 and 540. In this state, the bonding wires 510 and 540 are arranged above front surfaces of the PD submount 400 and the TIA carrier 420. The PD submount 400 and the TIA carrier 420 in this case can also be considered component mounting substrates.

The PD chip 100A includes four arrayed PD elements which convert the optical signals LB of four channels into electrical signals. In addition, the PD chip 100A also includes an anode electrode and a cathode electrode of each PD element, an anode electrode pad 110 which is provided on an upper surface-side of the element and which is connected to the anode electrode, and a cathode electrode pad 120 which is provided on the upper surface-side of the element and which is connected to the cathode electrode. Furthermore, the PD chip 100A includes a pair of anode electrode-side ground pads 130 which are provided on an element upper surface-side and which are arranged so as to sandwich the anode electrode pad 110. Moreover, the PD chip 100A includes a pair of cathode electrode-side ground pads 140 which are provided on the element upper surface-side and which are arranged so as to sandwich the cathode electrode pad 120. In the PD chip 100A, the anode electrode-side ground pads 130 and the cathode electrode-side ground pads 140 have been newly added.

The PD submount 400 is provided with a single through-hole 410 large enough to provide four channels through which the optical signals LB of four channels are to be incident from a rear surface of the PD chip 100A so as to penetrate front and rear surfaces of the PD submount 400. In other words, each PD element is configured as the back-illuminated PD chip 100A which is provided on a front surface-side of the PD submount 400 and which has the through-hole 410 which penetrates front and rear surfaces of the PD submount 400 so that the optical signals LB are collectively incident from the rear surface of the PD submount 400.

A size of the through-hole 410 is sufficiently larger than a diameter of light reception of the PD chip 100A. One reason therefor is that, normally, in order to avoid an effect of reflected return light in the optical signal LB, a configuration is adopted in which the optical signals LB are incident at an angle that deviates from a normal direction with respect to a light-receiving surface of the PD chip 100A. Another reason is to satisfy demands for a certain degree of freedom of a mounting position of the PD chip 100A with respect to the PD submount 400.

Even in the case of the chip capacitor 300 of four systems, the chip capacitor 300 assumes a role of a relay terminal which respectively applies DC voltage to the cathode electrode of the PD chip 100A from the outside and, at the same time, separates an AC component and a DC component from each other and blocks leakage of an AC signal to the outside. The TIA chip 200 is a TIA of four channels with an amplifier circuit of four systems, and includes a signal pad 210 for external input of an electrical signal and a signal pad 220 for external output of a differential electrical signal. In addition, the TIA chip 200 includes a ground pad 230 for grounding and a power supply/control/monitor pad 240 for supplying power, control, and monitoring.

The bonding wire 510 is used to electrically connect the anode electrode pad 110 of the PD chip 100A and the signal pad 210 for input of the TIA chip 200 to each other. The bonding wire 520 is used to electrically connect the cathode electrode pad 120 of the PD chip 100A and the chip capacitor 300 to each other.

In addition to the bonding wires 510 and 520, the bonding wire 530 which electrically connects the anode electrode-side ground pad 130 and the cathode electrode-side ground pad 140 of the PD chip 100A to each other is used. The bonding wire 530 can be considered the first electrical conductor and a total of eight bonding wires 530 are used to provide electric connection between the four pairs of anode electrode-side ground pads 130 and the four pairs of cathode electrode-side ground pad 140 of the PD chip 100A. Furthermore, the bonding wire 540 which electrically connects the anode electrode-side ground pad 130 and the ground pad 230 of the TIA chip 200 to each other is used. The bonding wire 540 can be considered the second electrical conductor and a total of eight bonding wires 540 are used to provide electric connection between the four pairs of anode electrode-side ground pads 130 of the PD chip 100A and the four pairs of ground pads 230 of the TIA chip 200.

In addition thereto, the bonding wire 550 which electrically connects the cathode electrode-side ground pad 140 of the PD chip 100A and a ground potential of the PD submount 400 to each other is used. The bonding wire 550 can be considered the third electrical conductor and a total of eight bonding wires 550 are used to provide electric connection between the four pairs of cathode electrode-side ground pads 140 of the PD chip 100A and the ground potential of the PD submount 400. The bonding wire 550 can be considered a substitute for providing electrical connection between the four pairs of ground pads 230 of the TIA chip 200 and the ground potential of the PD submount 400 to each other. Even with the optical receiver circuit 1000E, all of the bonding wires 510, 520, 530, 540, and 550 are arranged above front surfaces of the PD submount 40 and the TIA carrier 42.

Specifically, in the optical receiver circuit 1000E, the bonding wire 530 is constituted by bonding wires of which the number is twice that of the light-receiving elements that are light-receiving units of the PD chips 100A of four channels and each of which corresponds to each light-receiving element. In addition, the bonding wire 540 is similarly constituted by bonding wires of which the number is twice that of combinations of the light-receiving elements of the PD chips 100A of four channels and the TIAs of the TIA chips 200 of four channels and each of which corresponds to each combination. Furthermore, the bonding wire 550 is also constituted by bonding wires of which the number is twice that of the light-receiving elements that are light-receiving units of the PD chips 100A of four channels and each of which corresponds to each light-receiving element.

Alternatively, the bonding wire 550 may be used to electrically connect the four pairs of anode electrode-side ground pads 130 of the PD chip 100A and the ground potential of the PD submount 400 to each other. In addition, the bonding wire 550 may be used to electrically connect both the four pairs of cathode electrode-side ground pads 140 and the four pairs of anode electrode-side ground pads 130 of the PD chip 100A and the ground potential of the PD submount 400 to each other.

In the optical receiver circuit 1000E configured as described above, the four anode electrode pads 110 of the PD chip 100A and the four signal pads 210 of the TIA chip 200 are respectively electrically connected to each other by the four bonding wires 510. In addition, with respect to the bonding wire 510, the four pairs of anode electrode-side ground pads 130 and the four pairs of ground pads 230 of the TIA chip 200 are electrically connected to each other by eight bonding wires 540 so as to sandwich the bonding wires 510. Therefore, signal wirings of the channels respectively form a coplanar line, and even when the bonding wires 510 is slightly extended, an increase in impedance due to inductance of the bonding wires 510 is suppressed. As a result, preferable high-frequency characteristics are produced.

In addition, in the optical receiver circuit 1000E, the four pairs of cathode electrode-side ground pads 140 of the PD chip 100A and the ground potential of the PD submount 400 are respectively connected to each other by eight bonding wires 550. Therefore, there is no longer a constraint to make the gap between the PD chip 100A and the TIA chip 200 wide enough to prevent interference with a capillary tool of a wire bonding device. As a result, the length of the four bonding wires 510 which electrically connect the four anode electrode pads 110 of the PD chip 100A and the four signal pads 210 of the TIA chip 200 to each other can be freely controlled. As a result, combined with the effect of constructing the coplanar line formed by the bonding wires 510 and the bonding wires 540, preferable high-frequency characteristics can be produced.

Furthermore, in the optical receiver circuit 1000E, an electromagnetic field is closed between signal wirings and grounds on both sides thereof due to the formation of a coplanar line. Accordingly, compared to a case where the bonding wires 540 are not provided, a spread of an electromagnetic field of each of the bonding wires 510 is reduced. As a result, compared to a case where the bonding wires 540 are not provided, an amount of superposition on a signal of a given channel by a signal having been radiated and leaked from a counterpart bonding wire of an adjacent channel is reduced and crosstalk between channels can be suppressed.

Figure 9:
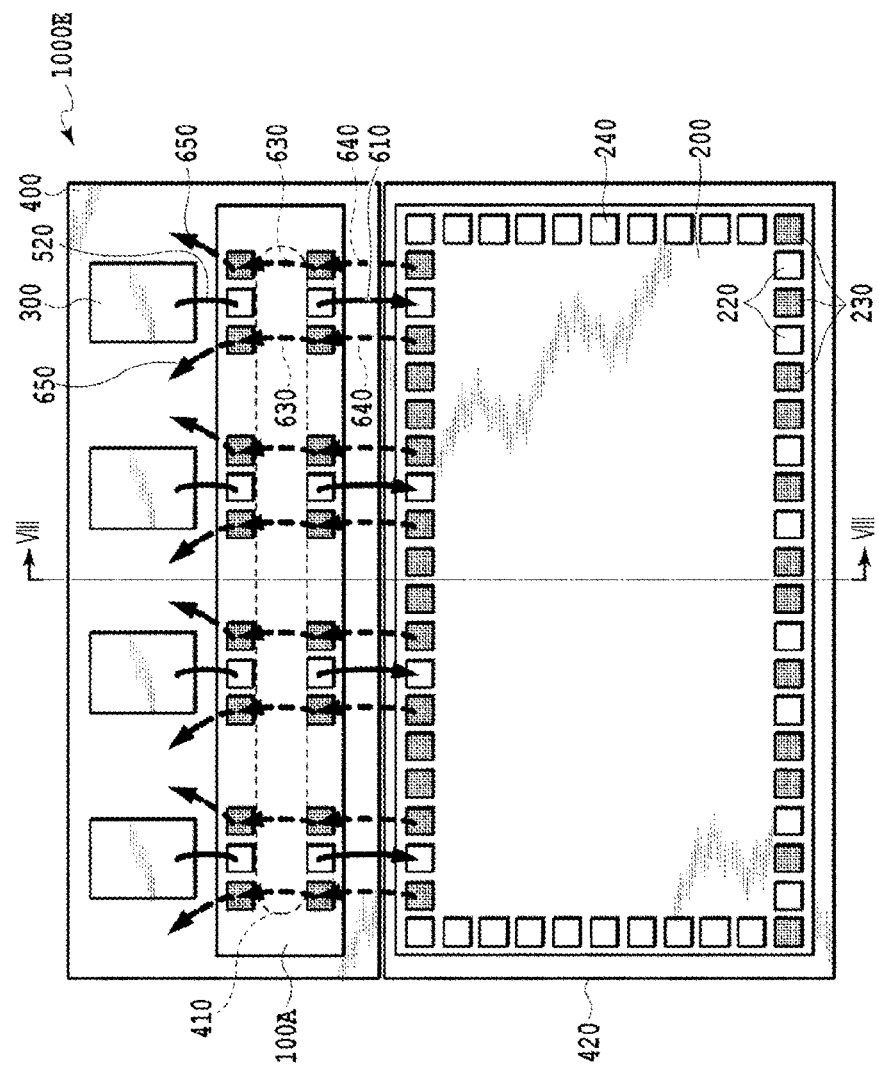
FIG. 9 is a plan view showing a path of a return current of the optical receiver circuit shown in FIG. 7.

FIG. 9 is a plan view showing a path of a return current of the optical receiver circuit 1000E. In the optical receiver circuit 1000E, when the optical signal LB incident from the rear surface of the PD chip 100A is received by a light-receiving unit (a light-receiving element) of a PD element, an electrical signal is generated. A high-frequency signal due to a photocurrent of the electrical signal is transmitted from the light-receiving unit of the PD chip 100A via the anode electrode pad 110 and the four bonding wires 510 to a transmission system which extends to the four signal pads 210. In this case, return currents 640, 630, and 650 flow via the respective bonding wires to the ground potential of the PD submount 400 in an opposite direction to a direction of transmission of the high-frequency signal of the photocurrent with respect to the transmission system.

Specifically, the return current 640 is routed through the eight bonding wires 540 which electrically connect the four pairs of anode electrode-side ground pads 130 of the PD chip 100A and the four pairs of ground pads 230 of the TIA chip 200 to each other. The return current 630 is routed through the eight bonding wires 530 which electrically connect the four pairs of anode electrode-side ground pads 130 and the four pairs of cathode electrode-side ground pads 140 of the PD chip 100A to each other. The return current 650 is routed through the eight bonding wires 550 which electrically connect the four pairs of cathode electrode-side ground pads 140 of the PD chip 100A and the ground potential of the PD submount 400 to each other. In addition, the return currents 640, 630, and 650 flow to the ground potential of the PD submount 400.

Figure 15:
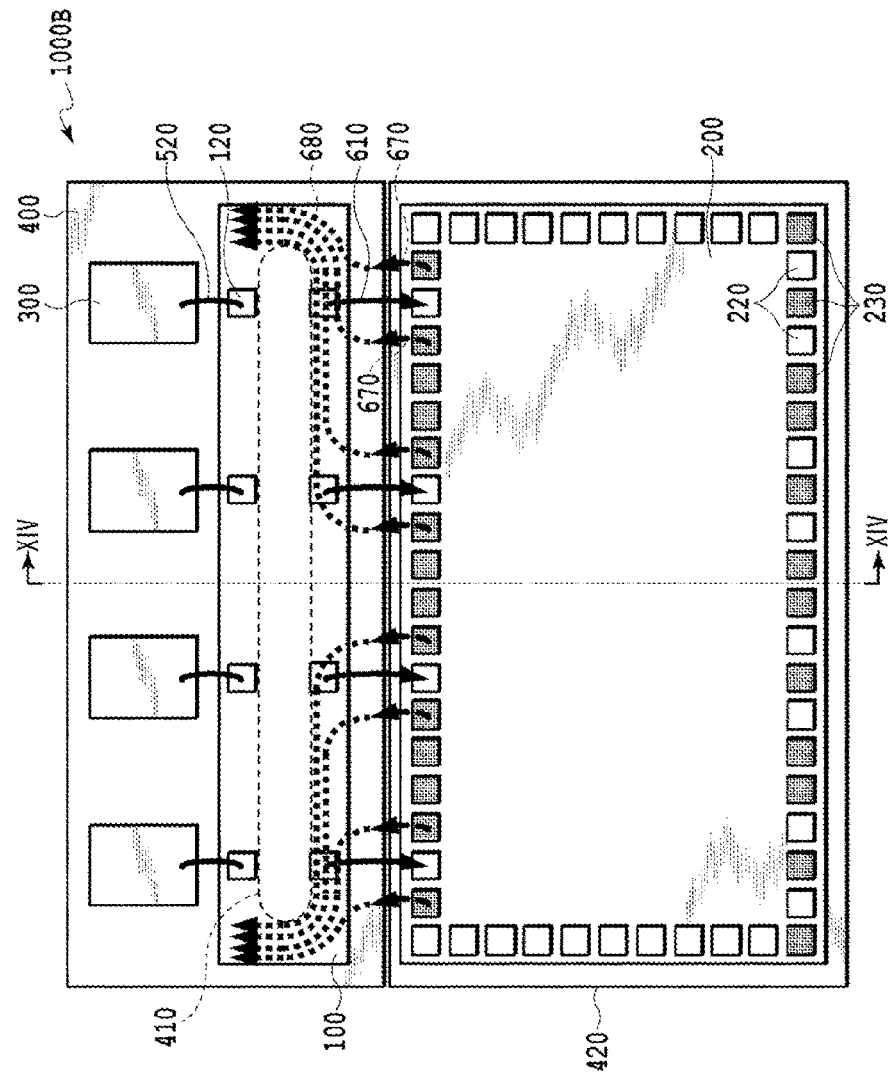
FIG. 15 is a diagram showing a path of a return current of the optical receiver circuit shown in FIG. 13.

Accordingly, a situation where the return currents 640, 630, and 650 flowing through the ground potential of the PD submount 400 bypass the return path that is created by the through-hole 410 is resolved. As a result, occurrences of unnecessary resonance, radiation noise, and the like can be suppressed and preferable high-frequency transmission characteristics can be produced. Since a channel on an inner side (a center side) of the optical receiver circuit 1000B of multiple channels described with reference to FIG. 15 is configured without the bonding wire 530 such as that shown in FIG. 7, an amount of bypass of the return path increases. By comparison, in the optical receiver circuit 1000E according to the third embodiment, the presence of the bonding wire 530 resolves a bypass of the return path as described with reference to FIG. 9 and an effect of improving high-frequency transmission characteristics increases.

In addition, generally, in the optical receiver circuit 1000B of multiple channels, since crosstalk from both sides are superimposed on inner (center side) channels as compared to outer (end side) channels, an amount of degradation of transmission quality due to crosstalk increases. By comparison, in the optical receiver circuit 1000E according to the third embodiment, an effect of improving transmission quality becomes conspicuous particularly in inner (center side) channels among multiple channels in combination with an effect of suppressing crosstalk between channels due to the formation of the coplanar line described above.

Figure 10:
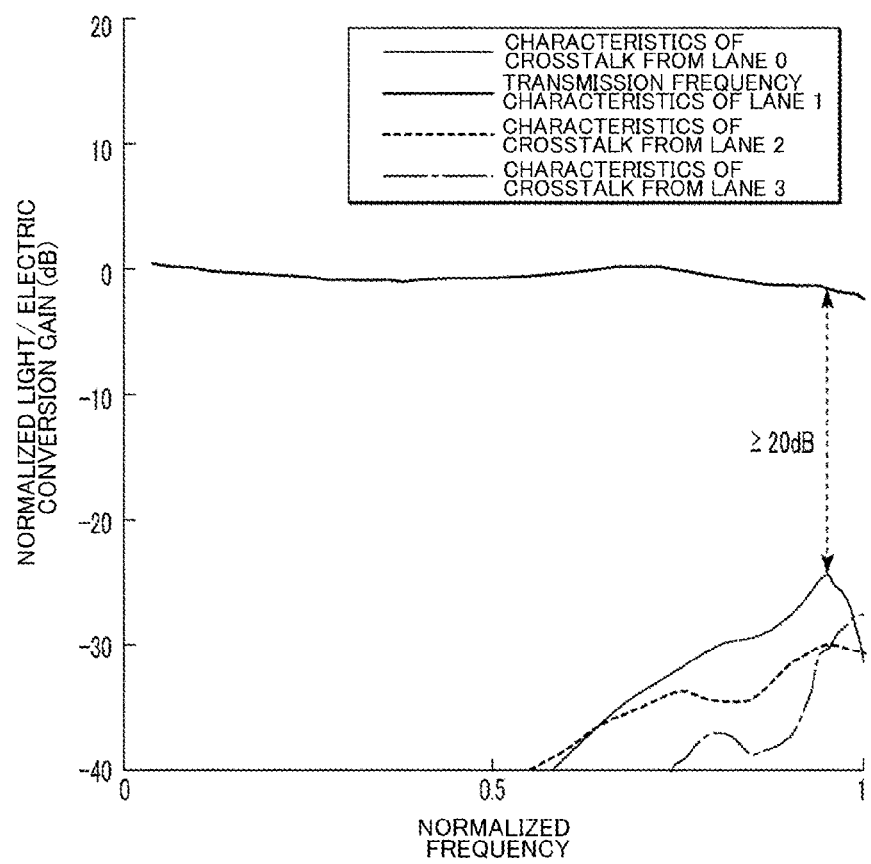
FIG. 10 is a diagram showing an example of frequency characteristics of the optical receiver circuit shown in FIG. 7 as a relationship of normalized light/electric conversion gain with respect to a normalized frequency.
Figure 11:
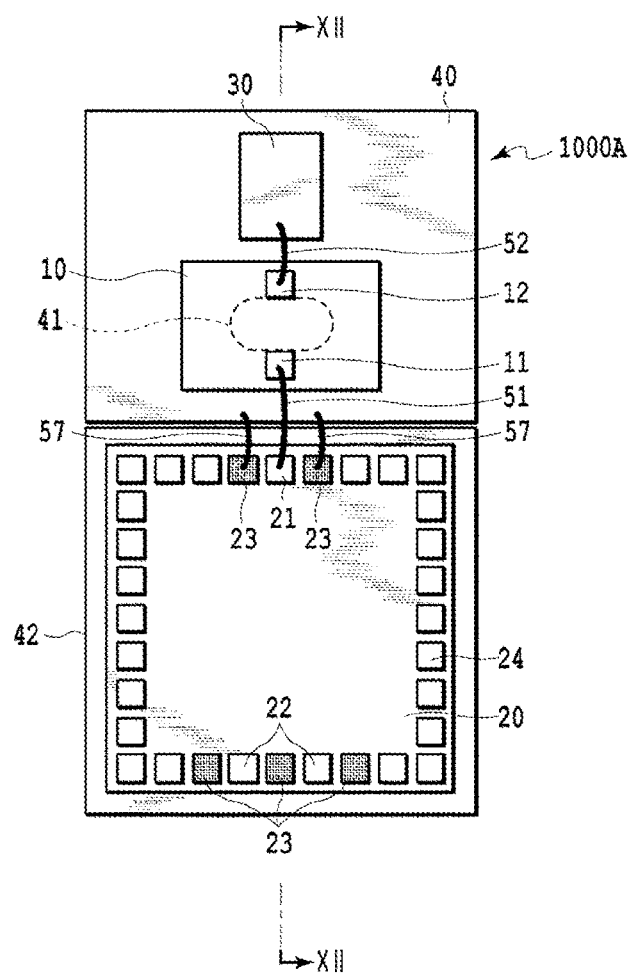
FIG. 11 is a plan view showing an implementation example related to a conventional optical receiver circuit for high-speed transmission.
Figure 12:
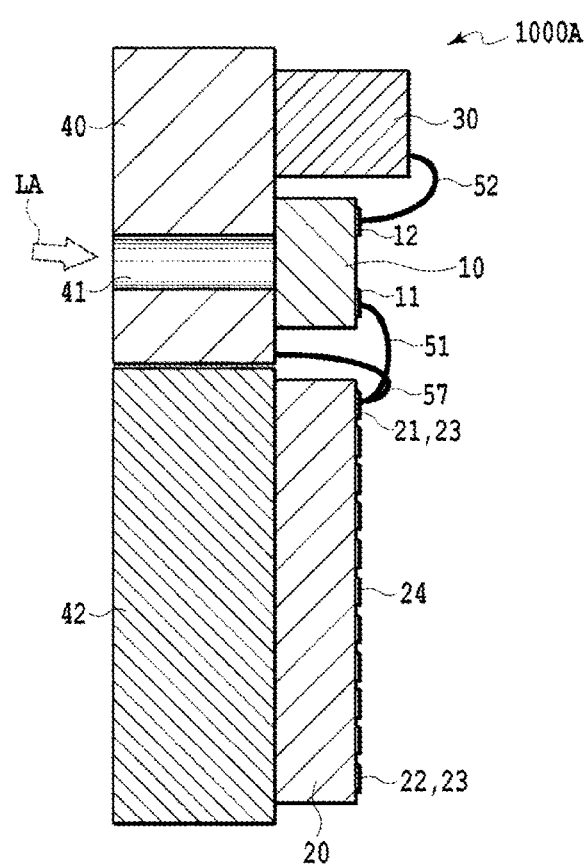
FIG. 12 is a sectional view taken along a XII-XII direction of the optical receiver circuit shown in FIG. 11.
Figure 13:
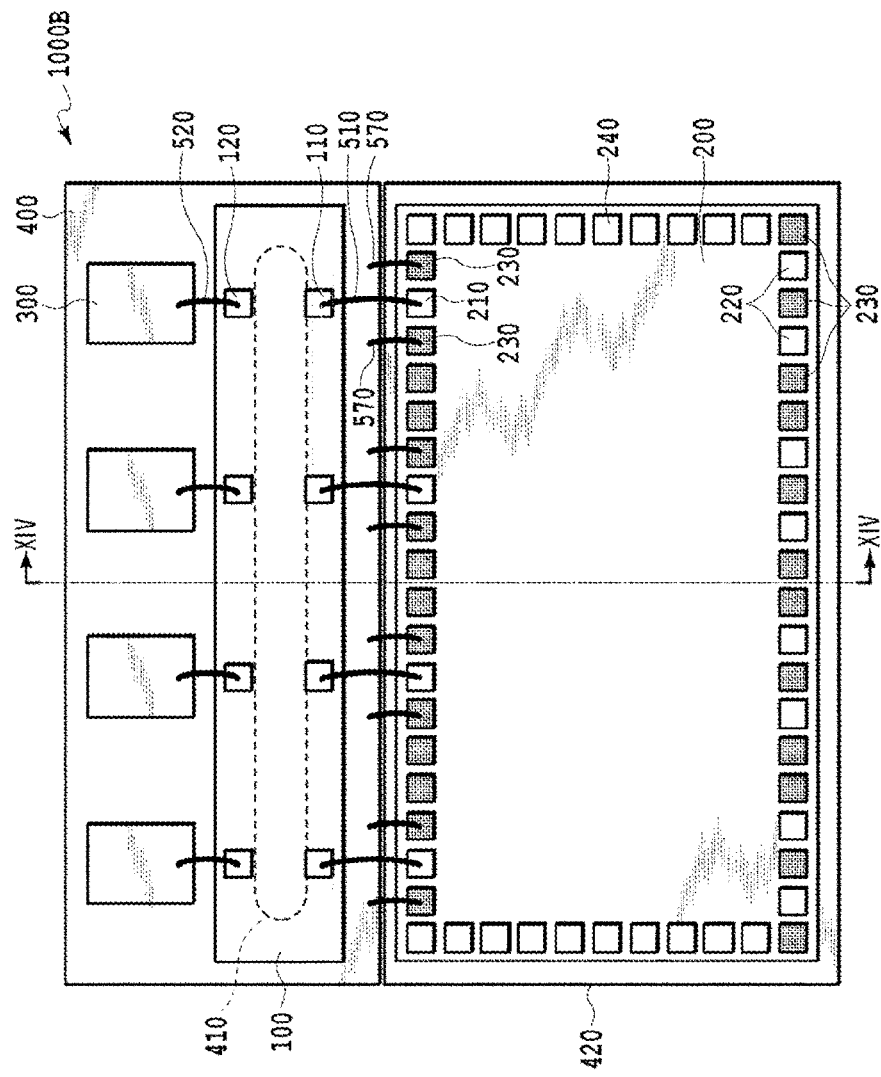
FIG. 13 is a plan view showing another implementation example related to the conventional optical receiver circuit for high-speed transmission.
Figure 14:
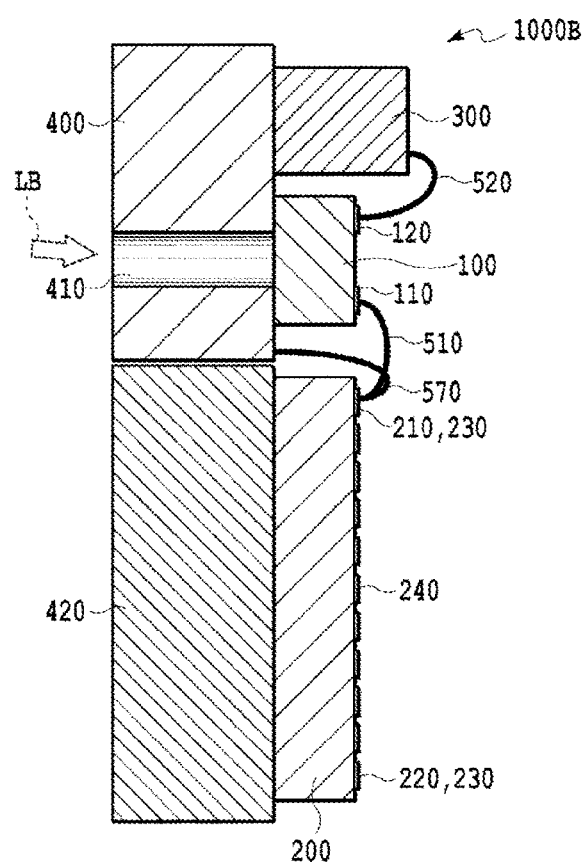
FIG. 14 is a sectional view taken along a XIV-XIV direction of the optical receiver circuit shown in FIG. 13.

FIG. 10 is a diagram showing an example of frequency characteristics of the optical receiver circuit 1000E as a relationship of normalized light/electric conversion gain (dB) with respect to a normalized frequency. In FIG. 10, focusing on channels of the return current 630 with respect to a transmission of the high-frequency signal current 610, transmission frequency characteristics of lane 1 being a channel adjacent to lane 0 being an innermost channel when lane 1 is considered a main signal is depicted by a bold line.

In addition, FIG. 10 shows characteristics of crosstalk from lanes 0 and 2 corresponding to the two channels that are adjacent to the channel of lane 1 and characteristics of crosstalk from lane 3 being an outermost channel that is adjacent to the channel of lane 2. Moreover, in FIG. 10, an abscissa represents normalized frequencies with a frequency corresponding to a transmission rate of a desired optical communication system as a reference value 1 and an ordinate displays a ratio of normalized light with respect to an electric conversion based on the transmission frequency characteristics of lane 1 as a gain dB.

FIG. 10 reveals that a ratio between the transmission frequency characteristics of lane 1 depicted by the bold line and characteristics of crosstalk from adjacent lane 0 depicted by a thin solid line represents a distance of 20 dB or more in terms of a difference value of normalized light/electric conversion gain with respect to the normalized frequency. In this manner, when ratios of crosstalk characteristics tend to differ from each other, high-frequency transmission characteristics are sustained in a stable manner and occurrences of unnecessary resonance and radiation noise are suppressed. As a result, in the optical receiver circuit 1000E, the bonding wires 510 and 520 are not required to function as an antenna as in the case of the optical receiver circuit 1000B, quality degradation of high-frequency transmission characteristics due to crosstalk is avoided, and quality is maintained in a highly reliable manner.

Figure 16:
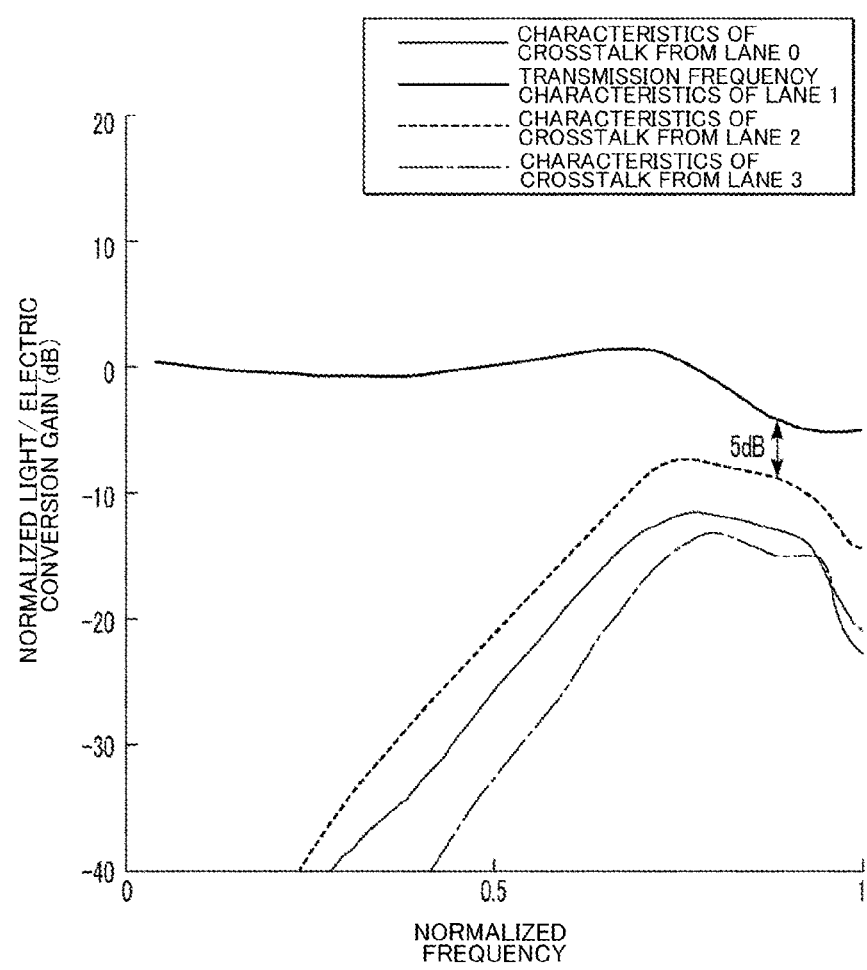
FIG. 16 is a diagram showing an example of frequency characteristics of the optical receiver circuit shown in FIG. 13 as a relationship of normalized light/electric conversion gain with respect to a normalized frequency.

Focusing on frequency characteristics, FIG. 16 showing the optical receiver circuit 1000B reveals that transmission frequency characteristics in the channel of lane 1 decline at a normalized frequency before reaching the reference value 1 and frequency characteristics have been degraded. By comparison, FIG. 10 showing the optical receiver circuit 1000E reveals that transmission frequency characteristics in the channel of lane 1 remain flat with respect to a normalized frequency until the reference value 1 is reached and frequency characteristics have been significantly improved.

Specifically, in the optical receiver circuit 1000B, a ratio between the transmission frequency characteristics in the channel of lane 1 and characteristics of crosstalk from an adjacent channel (a channel of lane 2) approaches approximately 5 dB in a most degraded state. By comparison, in the optical receiver circuit 1000E, since crosstalk is significantly suppressed, a ratio between the transmission frequency characteristics in the channel of lane 1 and characteristics of crosstalk from an adjacent channel (a channel of lane 0) is separated by 20 dB or more. Accordingly, even in the optical receiver circuit 1000E of multiple channels, preferable high-frequency transmission characteristics can be produced while suppressing occurrences of unnecessary resonance and radiation noise and reducing inter-channel crosstalk, and preferable transmission quality can be realized.

When it is difficult to provide the bonding wire 550 which connects the cathode electrode-side ground pad 140 and the ground potential of the PD submount 400 to each other, a similar countermeasure to that of the first embodiment and the second embodiment may be performed. Specifically, without using the bonding wire 550, a configuration may be adopted in which the anode electrode-side ground pad 130 of the PD chip 100A and the ground potential of the PD submount 400 are electrically connected to each other with another bonding wire. Even in this case, while the effect of freeing the return current from having to bypass the return path caused by the through-hole 410 is limited, an effect producing preferable high-frequency characteristics using an effect created by constructing a coplanar line is sustained. In this case, the coplanar line is formed by the bonding wire 510 and the bonding wire 540.

Even in the optical receiver circuit 1000E, a modification in which the anode electrode-side ground pad 130 and the cathode electrode-side ground pad 140 of the PD chip 100A are electrically connected by a wiring pattern on a front surface-side can be adopted in a similar manner to the second embodiment. This wiring pattern can also be considered the first electrical conductor. In this case, the bonding wire 540 which electrically connects the four pairs of anode electrode-side ground pads 130 of the PD chip 100A and the four pairs of ground pads 230 of the TIA chip 200 to each other can be considered the second electrical conductor. In addition, the bonding wire 550 which electrically connects the four pairs of cathode electrode-side ground pads 140 of the PD chip 100A and the ground potential of the PD submount 400 to each other can be considered the third electrical conductor.

Furthermore, while a configuration in which optical signals of four channels is converted into electrical signals of four channels has been described in association with the optical receiver circuit 1000E according to the third embodiment, the number of channels may be any number equal to or larger than 2 representing multiple channels other than four channels. In other words, an optical receiver circuit for multiple channels can be applied to configurations other than the configuration of four channels described in the third embodiment and, even in such cases, similar operational advantages are produced.

In any case, in the optical receiver circuit for multiple channels, the light-receiving unit (light-receiving element) of the PD element and the TIA of the TIA chip 200 are respectively provided in plurality. In such a configuration, the first electrical conductor (including wiring patterns) is constituted by first electrical conductors of which the number is twice that of the plurality of light-receiving elements and each of which corresponds to each light-receiving element. In addition, the second electrical conductor is also constituted by second electrical conductors of which the number is twice that of combinations of the plurality of light-receiving elements and the plurality of TIAs of the TIA chip 200 and each of which corresponds to each combination. Furthermore, the third electrical conductor is also constituted by third electrical conductors of which the number is twice that of the plurality of light-receiving elements and each of which corresponds to each light-receiving element. By adopting such a configuration, even when the configuration is intended for multiple channels, an unnecessary increase in impedance and occurrences of resonance and radiation noise can be suppressed and preferable high-frequency transmission characteristics can be produced.

The invention claimed is:

1. An optical receiver circuit, comprising:
a light-receiving element which converts an optical signal into an electrical signal; and
a transimpedance amplifier which amplifies and outputs the electrical signal obtained by the light-receiving element, wherein
the light-receiving element includes: an anode electrode and a cathode electrode; an anode electrode pad which is connected to the anode electrode; a cathode electrode pad which is connected to the cathode electrode; a plurality of anode electrode-side ground pads which are arranged so as to sandwich the anode electrode pad; and a plurality of cathode electrode-side ground pads which are arranged so as to sandwich the cathode electrode pad, and the optical receiver circuit includes:
a first electrical conductor which electrically connects the anode electrode-side ground pad and the cathode electrode-side ground pad to each other;
a second electrical conductor which electrically connects the anode electrode-side ground pad and a ground pad provided on an element front surface-side of the transimpedance amplifier to each other; and a third electrical conductor which electrically connects at least one of the cathode electrode-side ground pad and the anode electrode-side ground pad and a ground potential to each other.

2. The optical receiver circuit according to claim 1, wherein the light-receiving element and the transimpedance amplifier are respectively provided in plurality, the first electrical conductor is constituted by first electrical conductors of which the number is twice that of the plurality of light-receiving elements and each of which corresponds to each light-receiving element, the second electrical conductor is constituted by second electrical conductors of which the number is twice that of combinations of the plurality of light-receiving elements and the plurality of transimpedance amplifiers and each of which corresponds to each combination, and the third electrical conductor is constituted by third electrical conductors of which the number is twice that of the plurality of light-receiving elements and each of which corresponds to each light-receiving element.

3. The optical receiver circuit according to claim 1, wherein the light-receiving element or the plurality of light-receiving elements are provided on a front surface-side of a component mounting substrate and the light-receiving element or the plurality of light-receiving elements are configured as a back-illuminated chip having a single through-hole so as to cause an optical signal to be independently incident or to cause optical signals to be collectively incident from a rear surface of the component mounting substrate.

4. The optical receiver circuit according to claim 1, wherein the first electrical conductor, the second electrical conductor, and the third electrical conductor are bonding wires which are electric wires.

5. The optical receiver circuit according to claim 1, wherein the first electrical conductor is a wiring pattern, and the second electrical conductor and the third electrical conductor are bonding wires which are electric wires.

6. The optical receiver circuit according to claim 5, wherein the wiring pattern is constituted by wiring patterns of which the number is twice that of the plurality of light-receiving elements and each of which corresponds to each light-receiving element.

7. The optical receiver circuit according to claim 2, wherein the light-receiving element or the plurality of light-receiving elements are provided on a front surface-side of a component mounting substrate and the light-receiving element or the plurality of light-receiving elements are configured as a back-illuminated chip having a single through-hole so as to cause an optical signal to be independently incident or to cause optical signals to be collectively incident from a rear surface of the component mounting substrate.

8. The optical receiver circuit according to claim 2, wherein the first electrical conductor, the second electrical conductor, and the third electrical conductor are bonding wires which are electric wires.

9. The optical receiver circuit according to claim 3, wherein the first electrical conductor, the second electrical conductor, and the third electrical conductor are bonding wires which are electric wires.

10. The optical receiver circuit according to claim 2, wherein the first electrical conductor is a wiring pattern, and the second electrical conductor and the third electrical conductor are bonding wires which are electric wires.

11. The optical receiver circuit according to claim 3, wherein the first electrical conductor is a wiring pattern, and the second electrical conductor and the third electrical conductor are bonding wires which are electric wires.

* * * * *